US011195086B2

(12) United States Patent
Holmes et al.

(10) Patent No.: US 11,195,086 B2
(45) Date of Patent: Dec. 7, 2021

(54) NEUROMORPHIC COMPUTING DEVICE UTILIZING A BIOLOGICAL NEURAL LATTICE

(71) Applicant: International Business Machines Corporation, Armonk, NY (US)

(72) Inventors: Steven J. Holmes, Ossining, NY (US); Devendra K. Sadana, Pleasantville, NY (US); Stephen W. Bedell, Wappingers Falls, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 16/423,967

(22) Filed: May 28, 2019

(65) Prior Publication Data
US 2020/0380343 A1    Dec. 3, 2020

(51) Int. Cl.
| | |
|---|---|
| *G06N 3/06* | (2006.01) |
| *H01L 31/173* | (2006.01) |
| *H01L 31/0304* | (2006.01) |
| *G06N 3/063* | (2006.01) |
| *H01L 31/18* | (2006.01) |
| *H01L 33/32* | (2010.01) |
| *H01L 33/00* | (2010.01) |

(52) U.S. Cl.
CPC .......... *G06N 3/061* (2013.01); *G06N 3/0635* (2013.01); *H01L 31/03044* (2013.01); *H01L 31/173* (2013.01); *H01L 31/1852* (2013.01); *H01L 31/1856* (2013.01); *H01L 33/007* (2013.01); *H01L 33/32* (2013.01)

(58) Field of Classification Search
CPC ......... G06N 3/061–067; A61N 5/0622; G01N 21/6454; G01N 21/6452; G01N 33/4836
See application file for complete search history.

(56) References Cited

U.S. PATENT DOCUMENTS

| | | | |
|---|---|---|---|
| 7,489,012 B2 | 2/2009 | La Rosa et al. | |
| 7,947,626 B2 | 5/2011 | Ma et al. | |
| (Continued) | | | |

FOREIGN PATENT DOCUMENTS

WO    2010053238 A2    5/2010

OTHER PUBLICATIONS

Hasan MF, Berdichevsky Y. Neural Circuits on a Chip. Micromachines. 2016; 7(9): 157. https://doi.org/10.3390/mi7090157 (Year: 2016).*

(Continued)

*Primary Examiner* — Alia Sabur
(74) *Attorney, Agent, or Firm* — Jeffrey S LaBaw; Ryan, Mason & Lewis, LLP (57) ABSTRACT

Techniques are disclosed for fabricating and using a neuromorphic computing device including biological neurons. For example, a method for fabricating a neuromorphic computing device includes forming a channel in a first substrate and forming at least one sensor in a second substrate. At least a portion of the channel in the first substrate is seeded with a biological neuron growth material. The second substrate is attached to the first substrate such that the at least one sensor is proximate to the biological neuron growth material and growth of the seeded biological neuron growth material is stimulated to grow a neuron in the at least a portion of the channel.

14 Claims, 7 Drawing Sheets

(56) References Cited

U.S. PATENT DOCUMENTS

| | | |
|---|---|---|
| 9,283,386 B2 | 3/2016 | Park et al. |
| 2004/0106168 A1 | 6/2004 | Evans |
| 2007/0092958 A1 | 4/2007 | Syed et al. |
| 2010/0158756 A1* | 6/2010 | Taylor .................. B01L 3/527 |
| | | 422/69 |
| 2011/0213743 A1 | 9/2011 | Choi et al. |
| 2012/0129258 A1 | 5/2012 | Baek et al. |
| 2018/0016538 A1* | 1/2018 | Bugaj .................. C12M 31/02 |

OTHER PUBLICATIONS

Mao, Dacheng, Li, Ningwei Xiong, Zheshun, Sun, Yubing, Xu, Guangyu. (2019). Single-Cell Optogenetic Control of Calcium Signaling with a High-Density Micro-LED Array. iScience. 21. 10.1016/j.isci.2019.10.024 (Year: 2019).*

Arata Nakajima et al. "CMOS image sensor integrated with micro-LED and multielectrode arrays for the patterned photostimulation and multichannel recording of neuronal tissue," Opt. Express 20, 6097-6108 (2012)) (Year: 2012).*

G.R. Anderson et al., "Postsynaptic Adhesion GPCR Latrophilin-2 Mediates Target Recognition in Entorhinal-Hippocampal Synapse Assembly," Journal of Cell Biology, Nov. 6, 2017, pp. 3831-3846, vol. 216, No. 11.

Sciencedaily, "A Look at the Space Between Mouse Brain Cells," Cell Press, Feb. 22, 2018, 2 pages.

P.D. Chowdary et al., "Nanoparticle-Assisted Optical Tethering of Endosomes Reveals the Cooperative Function of Dyneins in Retrograde Axonal Transport," Scientific Reports, Dec. 10, 2015, 11 pages, vol. 5.

L. Kaplan et al., "Rotation of Endosomes Demonstrates Coordination of Molecular Motors During Axonal Transport," Science Advances, Mar. 7, 2018, 13 pages, vol. 4, No. 3.

A. Sebastian et al., "Temporal Correlation Detection Using Computational Phase-Change Memory," Nature Communications, Oct. 24, 2017, 10 pages, vol. 8, No. 1.

Yuri I. Manin, "Error-Correcting Codes and Neural Networks," Selecta Mathematica: New Series, Mar. 2018, pp. 521-530, vol. 24, No. 1.

M. Hu et al., "Memristor Crossbar-Based Neuromorphic Computing System: A Case Study," IEEE Transactions on Neural Networks and Learning Systems, Oct. 2014, pp. 1864-1878, vol. 25, No. 10.

A. Sengupta et al., "Spin-TransferTorque Magnetic Neuron for Low Power Neuromorphic Computing," IEEE International Joint Conference on Neural Networks (IJCNN), Jul. 12-17, 2015, 7 pages.

J. Torrejon et al., "Neuromorphic Computing with Nanoscale Spintronic Oscillators," Nature, Jul. 27, 2017, pp. 428-432, vol. 547, No. 7664.

M.F. Hasan et al., "Neural Circuits on a Chip," Micromachines, Sep. 2016, 15 pages, vol. 7, No. 9.

A.M. Paca et al., "Functional Cortical Neurons and Astrocytes from Human Pluripotent Stem Cells in 3D Culture," Nature Methods, Jul. 2015, 21 pages, vol. 12, No. 7.

F. Birey et al., "Assembly of Functionally Integrated Human Forebrain Spheroids," Nature, May 4, 2017, 24 pages, vol. 545, No. 7652.

Sergiu P. Paşca. "The Rise of Three-Dimensional Human Brain Cultures," Nature, Jan. 25, 2018, pp. 437-445, No. 553.

G. Heimberg et al., "Low Dimensionality in Gene Expression Data Enables the Accurate Extraction of Transcriptional Programs from Shallow Sequencing," Cell Systems, Apr. 27, 2016, 13 pages, vol. 2, No. 4.

Wikipedia, "STED Microscopy," https://en.wikipedia.org/wiki/STED_microscopy, Feb. 10, 2019, 9 pages.

S. Ambrogio et al., "Equivalent-Accuracy Accelerated Neural-Network Training Using Analogue Memory," Nature, Jun. 7, 2018, 22 pages, vol. 558, No. 7708.

Jung-Hwa Tao-Cheng, "Stimulation-Induced Structural Changes at the Nucleus, Endoplasmic Reticulum and Mitochondria of Hippocampal Neurons," Molecular Brain, Jul. 27, 2018, 14 pages, vol. 11, No. 44.

E. Messaoudi et al., "Sustained Arc/Arg3.1 Synthesis Controls Long-Term Potentiation Consolidation through Regulation of Local Actin Polymerization in the Dentate Gyrus In Vivo," The Journal of Neuroscience, Sep. 26, 2007, pp. 10445-10455, vol. 27, No. 39.

S. Das et al., "A Transgenic Mouse for Imaging Activity-Dependent Dynamics of Endogeneous Arc mRNA in Live Neurons," Science Advances, Jun. 20, 2018, 15 pages, vol. 4, No. 6.

Y. Cao et al., "Nondestructive Nanostraw Intracellular Sampling for Longitudinal Cell Monitoring," Proceedings of the National Academy of Science of the USA, Mar. 7, 2017, 9 pages.

* cited by examiner

NEUROMORPHIC COMPUTING DEVICE UTILIZING A BIOLOGICAL NEURAL LATTICE

BACKGROUND

Synthetic neural networks have been utilized in semiconductor memory devices in an effort to mimic biological neural structures. However, synthetic neural networks do not provide the same level of functionality that may be found in biological neural structures. Biological neural structures are often highly complex in nature and are often difficult to characterize effectively. For example, in a highly complex neural network such as a brain, it is often difficult to isolate, characterize and utilize specific neurons due to the sheer density of biological neural material. Instead, the biological signals obtained by sensors or other devices that are inserted into the biological neural structures typically comprise noisy signals that include information associated with more than one neuron or even millions of neurons. The use of such noisy biological neural structures in a semiconductor memory device is a challenge.

SUMMARY

Embodiments include device structures and techniques for fabricating and using a neuromorphic computing device comprising biological neurons. For example, one embodiment includes a method for fabricating a neuromorphic computing device. The method includes forming a channel in a first substrate and forming at least one sensor in a second substrate. At least a portion of the channel in the first substrate is seeded with a biological neuron growth material. The second substrate is attached to the first substrate such that the at least one sensor is proximate to the biological neuron growth material and growth of the seeded biological neuron growth material is stimulated to grow a neuron in the at least a portion of the channel.

Another embodiment includes a neuromorphic computing device comprising a first substrate comprising a channel. The channel comprises a neuron seeded and grown therein. The neuromorphic computing device further comprises a second substrate comprising at least one sensor. The second substrate is attached to the first substrate such that the at least one sensor is proximate to the seeded and grown neuron. The neuromorphic computing device further comprises a third substrate including a semiconductor device. The third substrate is attached to the second substrate such that the at least one sensor is in electrical communication with the semiconductor device.

Another embodiment includes a method of using a neuromorphic computing device. The method comprises stimulating a neuron seeded and grown within a channel of a first substrate by at least one sensor of a second substrate that is attached to the first substrate such that the at least one sensor is proximate to the neuron and obtaining a response to the stimulation from the neuron by the at least one sensor. The method further comprises providing the obtained response to a semiconductor device of a third substrate that is attached to the second substrate such that the at least one sensor is in electrical communication with the semiconductor device and characterizing the obtained response by the semiconductor device.

Other embodiments will be described in the following detailed description of embodiments, which is to be read in conjunction with the accompanying figures.

DETAILED DESCRIPTION

Illustrative embodiments will now be described in further detail with regard to techniques and device structures for fabricating and utilizing a simplified network of neurons in a specific template, referred to herein as a neural lattice, that is connected to a semiconductor computing device.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
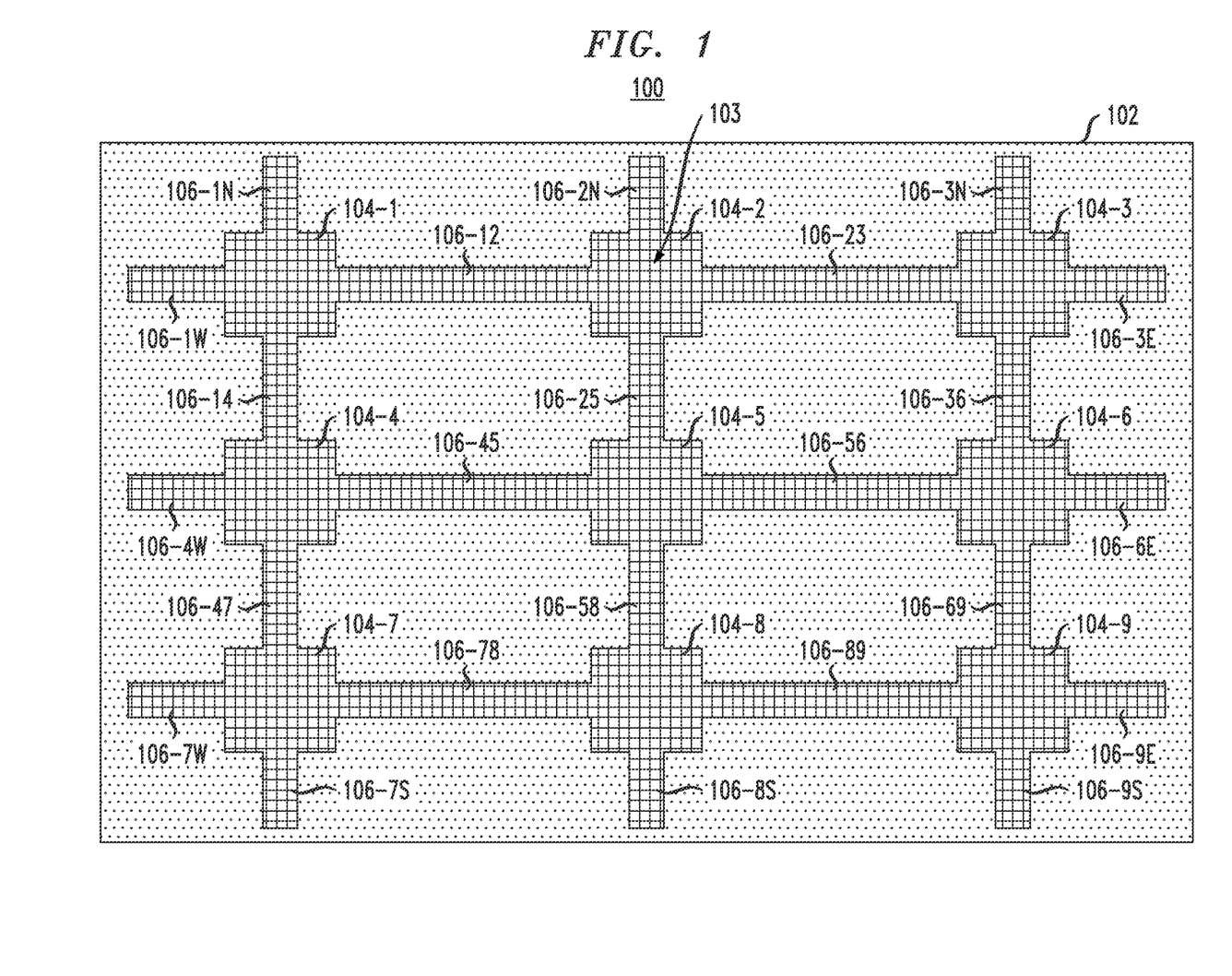
FIG. 1 is a schematic view of an example neural lattice of a neuromorphic computing device, according to an embodiment of the present disclosure.
Figure 2:
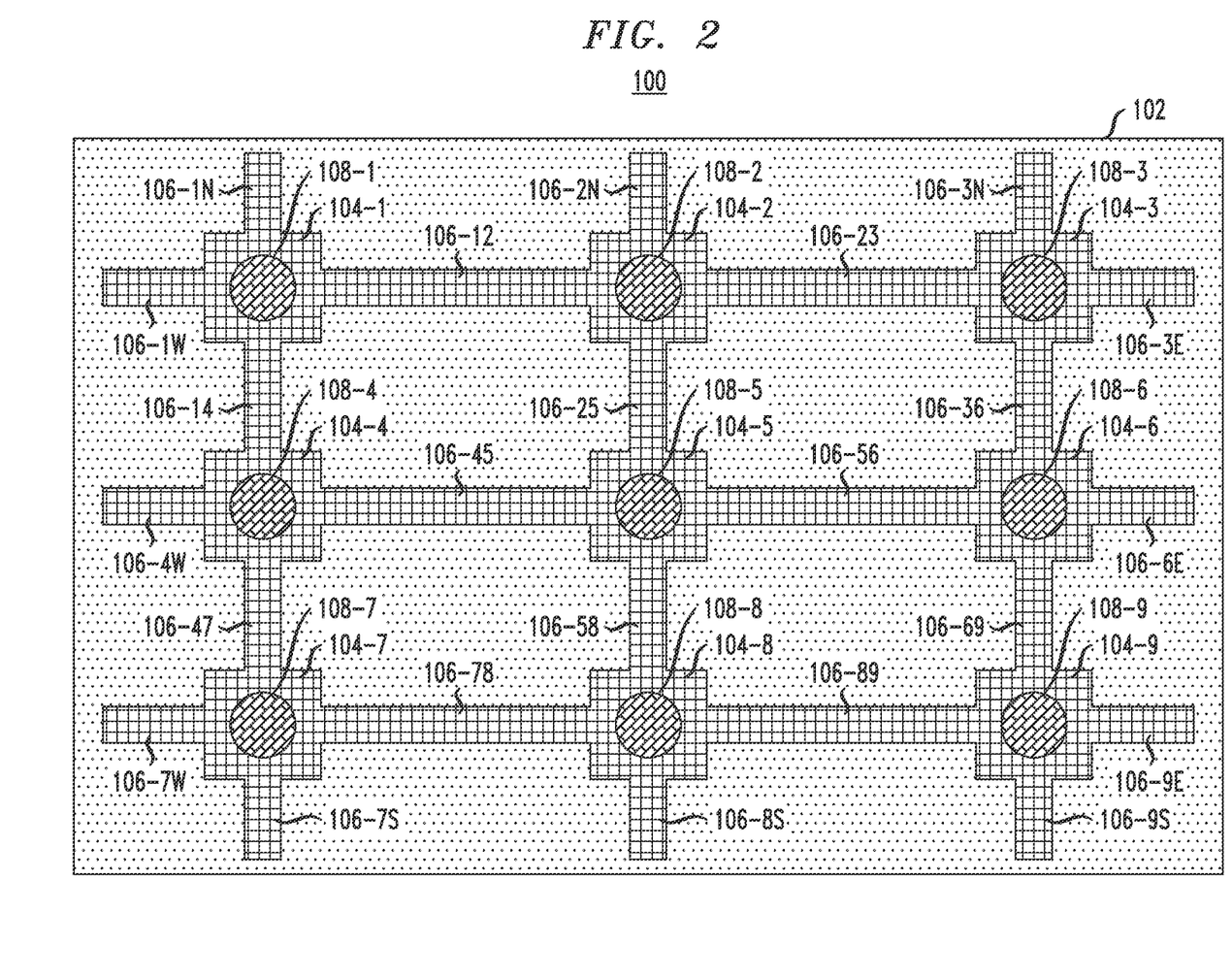
FIG. 2 is a schematic view of the neural lattice of FIG. 1 illustrating the seeding of neuron growth materials in the neural lattice, according to an embodiment of the present disclosure.
Figure 3:
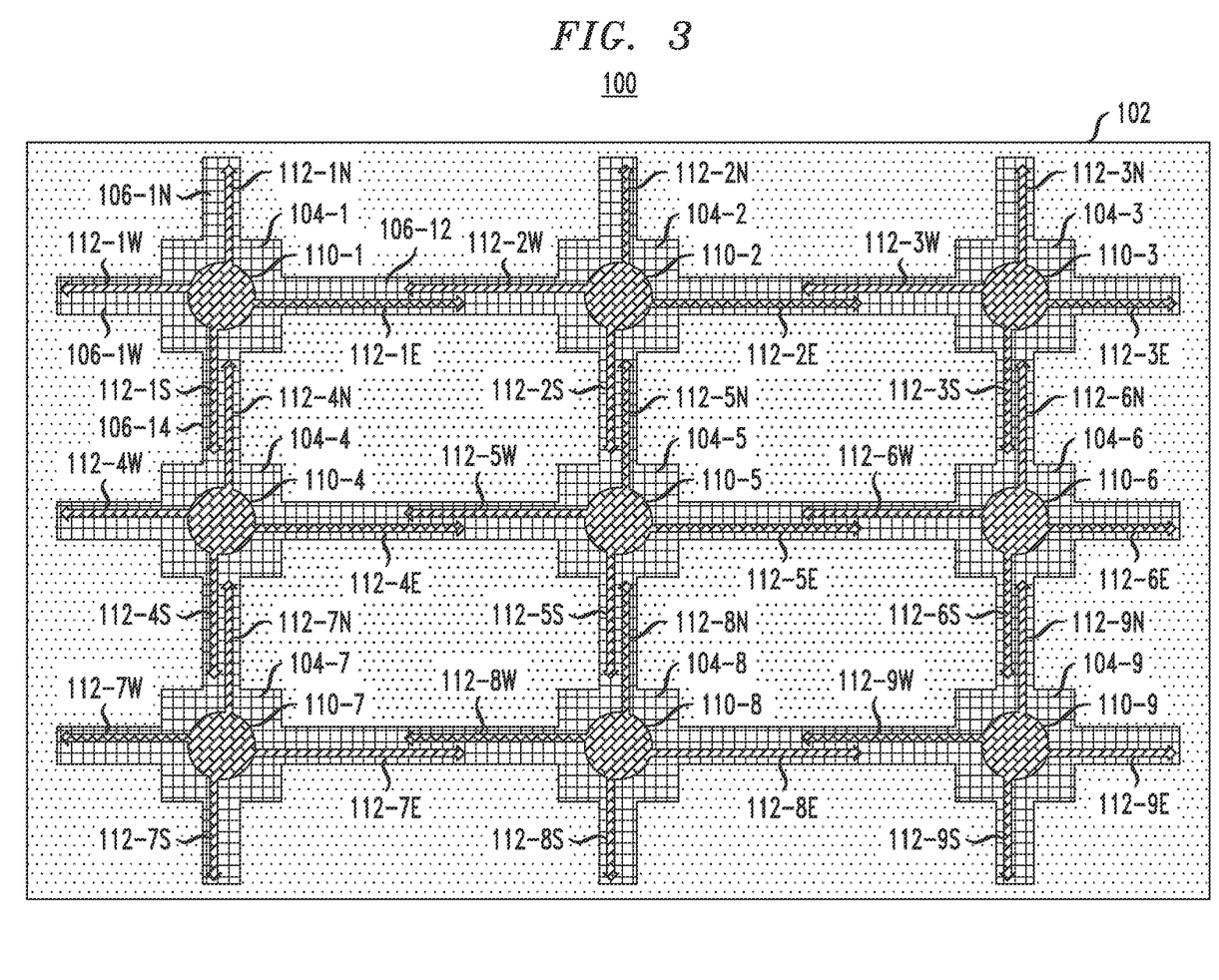
FIG. 3 is a schematic view of the neural lattice of FIG. 2 illustrating the growth of the neuron growth materials into neurons, according to an embodiment of the present disclosure.

FIGS. 1-3 are views illustrating the fabrication of a neural lattice 100 according to an illustrative embodiment. With reference to FIG. 1, neural lattice 100 comprises a substrate 102 and a channel 103 formed in the substrate 102. In some embodiments, substrate 102 illustratively comprises, for example, a silicon-based substrate, an aluminum oxide-based substrate, a GaN-based substrate, an amorphous carbon-based substrate, a polydimethylsiloxane-based substrate, a polyimide-based substrate, a polyurethane-based substrate, a silicon oxide-based substrate, a silicon nitride-based substrate, an aluminum nitride-based substrate, or other similar substrate. In illustrative embodiments, and of these example substrates can be free standing substrates or films on another substrate, such as, e.g., a silicon-based wafer.

Channel 103 is formed in the substrate 102 using generally available techniques such as, for example, lithographic and etching techniques. In some embodiments, for example, a lithographic mask may be formed on the substrate 102 and lithography may be used to define a pattern on the lithographic mask which may then be transferred to the substrate 102 via standard etching techniques such as, for example, reactive-ion etching (RIE), wet etching, or other similar techniques.

In an illustrative embodiment, as seen in FIG. 1, channel 103 comprises a plurality of seed chambers 104-1 through 104-9, collectively referred to herein as seed chambers 104. In the illustrative embodiment of FIG. 1, seed chambers 104 are arranged in a two-dimensional lattice. While nine seed chambers 104 are illustrated in the embodiment of FIG. 1, neural lattice 100 may comprise any other number of seed chambers in other embodiments.

Channel 103 also comprises seed chamber extensions 106 that extend between respective pairs of the seed chambers 104. For example, seed chamber extension 106-12 extends between seed chambers 104-1 and 104-2, seed chamber extension 106-23 extends between seed chambers 104-2 and 104-3, seed chamber extension 106-14 extends between seed chambers 104-1 and 104-4, seed chamber extension 106-25 extends between seed chambers 104-2 and 104-5 and so forth such that channel 103 comprises seed chamber extensions 106-12, 106-23, 106-14, 106-25, 106-36, 106-45, 106-56, 106-47, 106-58, 106-69, 106-78, and 106-89 extending between their respective pairs of seed chambers 104.

In addition, channel 103 also comprises seed chamber extensions 106 that extend from one seed chamber 104 but do not reach another seed chamber, for example, because they are on the sides or edges of the neural lattice 100. For example, seed chamber extensions 106-1W and 106-1N extend from seed chamber 104-1, seed chamber extension 106-2N extends from seed chamber 104-2, seed chamber extensions 106-3E and 106-3N extend from seed chamber 104-3, seed chamber extension 106-4W extends from seed chamber 104-4, seed chamber extension 106-6E extends from seed chamber 104-6, seed chamber extensions 106-7W and 106-7S extend from seed chamber 104-7, seed chamber extension 106-8S extends from seed chamber 104-8 and seed chamber extensions 106-9E and 106-9S extend from seed chamber 104-9.

With reference now to FIG. 2, neuron growth materials 108 are seeded into the channel 103. In illustrative embodiments, neuron growth materials 108 may comprise, for example, neuron stem cells. In illustrative embodiments, neuron growth materials 108-1 through 108-9 are seeded into respective seed chambers 104-1 through 104-9, as shown in FIG. 2.

With reference now to FIG. 3, fluid may be supplied to channel 103 to stimulate growth of the neuron growth materials 108-1 through 108-9 (FIG. 2) into respective neurons 110-1 through 110-9. The neurons 110 comprise axons 112 extending into the chamber extensions 106. For example, as seen in FIG. 3, neuron 110-1 has an axon 112-1E extending into chamber extension 106-12, an axon 112-1S extending into chamber extension 106-14, an axon 112-1W extending into chamber extension 106-1W and an axon 112-1N extending into chamber extension 106-1N. Neurons 110-2 through 110-9 similarly have axons 112-2E through 112-9E, 112-2S through 112-9S, 112-2W through 112-9W and 112-2N through 112-9N extending into respective chamber extensions 106 (FIG. 2).

As can be seen in FIG. 3, the axons 112 of adjacent neurons 110 extending within a respective chamber extension 106 may overlap such that the adjacent neurons 110 may communicate with one another via chemical reactions or electrical reactions at their respective axons 112. For example, as seen in FIG. 3, axon 112-1E of neuron 110-1 and axon 112-2W of neuron 110-2 are proximate to each other within chamber extension 106-12 and may communicate with each over via chemical or electrical reactions within chamber 106-12.

Figure 4:
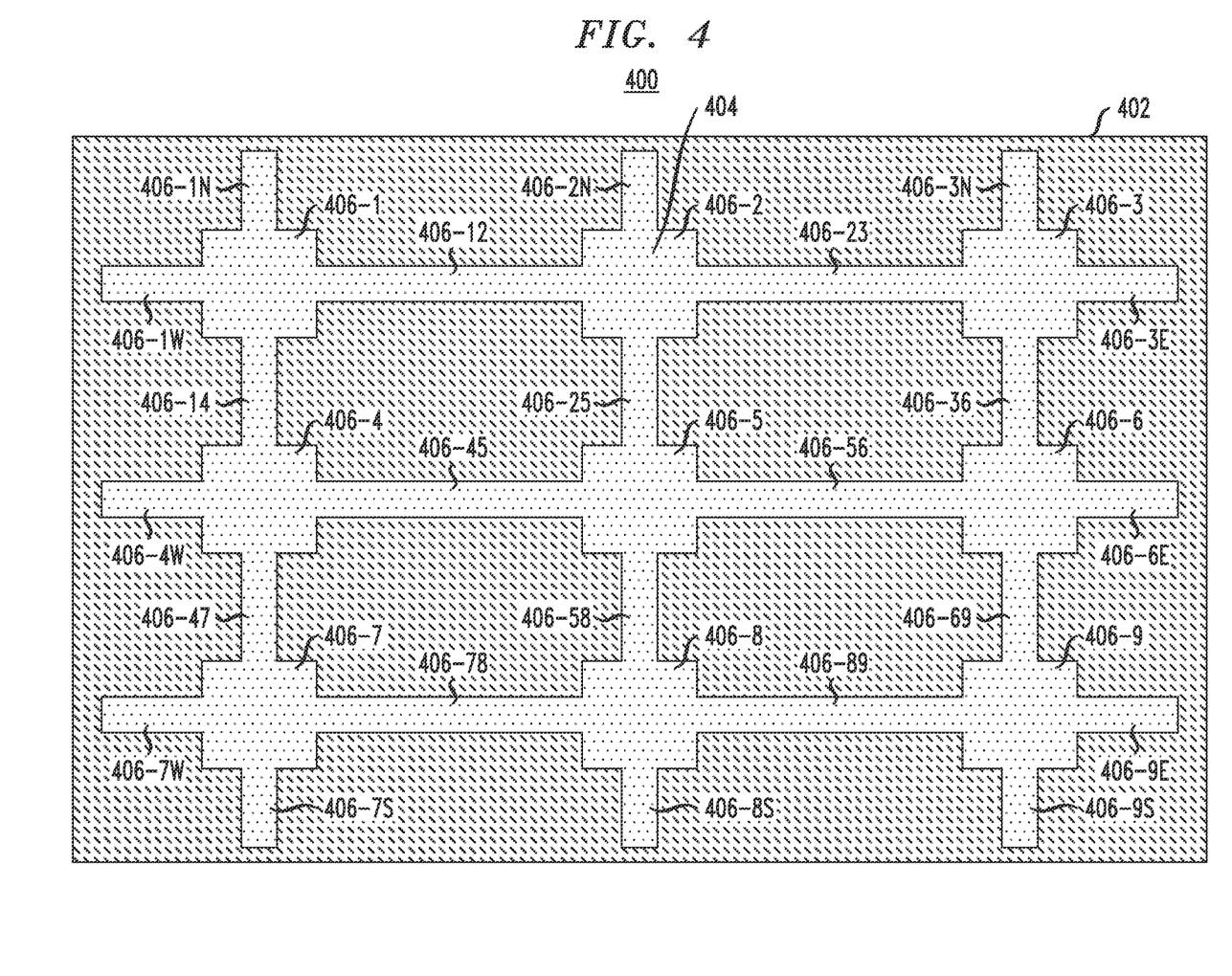
FIG. 4 is a schematic view of an example sensor lattice of a neuromorphic computing device, according to an embodiment of the present disclosure.

FIG. 4 is a view illustrating a sensor lattice 400 according to an illustrative embodiment. With reference to FIG. 4, in illustrative embodiments, sensor lattice 400 comprises a substrate 402 and one or more sensors 404 formed in the substrate 402 in a similar pattern to the channel 103 of neural lattice 100. For example, when sensor lattice 400 is attached to neural lattice 100, the sensors 404 may overlap or overlay channel 103 such that the sensors 404 are located proximate to the seed chambers 104 and chamber extensions 106 of the neural lattice 100. By forming the sensors 404 in a similar pattern as the channel 103, the sensors 404 may be used to monitor and obtain information separately from each of the individual neurons 110 and axons 112 while limiting interference from adjacent neurons 110 or other sources. In addition, sensors 404 may also or alternatively be used to stimulate the neurons 110 and axons 112, for example, to effect changes in the neurons 110 and axons 112. For example, sensors 404 may be configured to provide electrical, optical, or chemical stimulation to individual neurons 110 and axons 112 as desired. In some embodiments, substrate 402 illustratively comprises a sapphire-based material such as, e.g., a sapphire ($Al_2O_3$) substrate.

As shown in FIG. 4, for example, the one or more sensors 404 may comprise sensor portions 406-1 through 406-9 that correspond to seed chambers 104-1 through 104-9 (FIGS. 1-3), and sensor portions 406-1N, 406-12, 406-14, 406-1W, 406-2N, 406-23, 406-25, 406-3N, 406-3E, 406-36, 406-45, 406-47, 406-4W, 406-56, 406-58, 406-6E, 406-69, 406-78, 406-7S, 406-7W, 406-89, 406-8S, 406-9E and 406-9S that correspond to the chamber extensions 106 (FIGS. 1-3) described above. Each sensor portion 406 may comprise one or more sensor devices.

Figure 5:
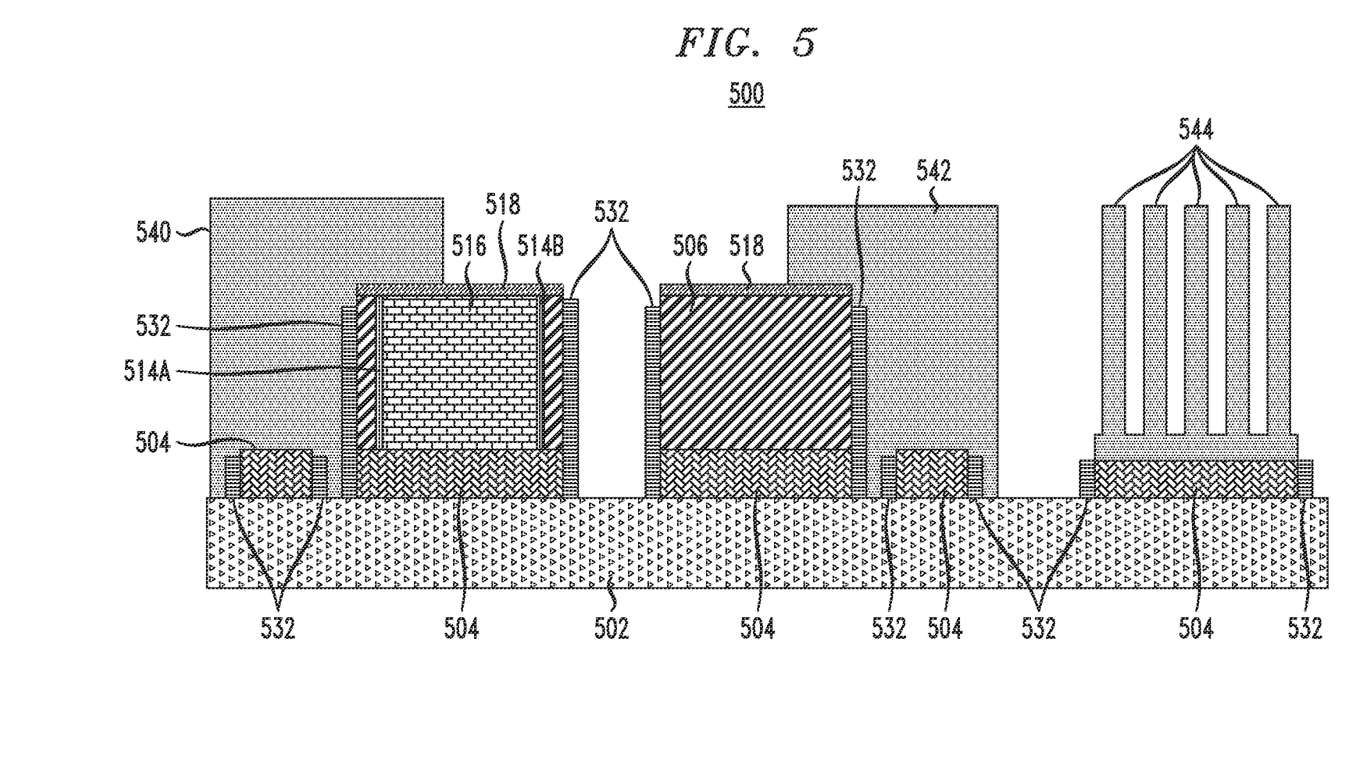
FIG. 5 is a schematic cross-sectional side view of an example optogenetic sensor, according to an embodiment of the present disclosure.

In some embodiments, each sensor portion 406 may comprise one or more optogenetic devices that integrate a light-emitting diode, a light sensor, and bio-electrode sensors on a substrate. In some embodiments, other types of sensors may be used. With reference now to FIG. 5, an example optogenetic device 500 is illustrated.

Optogenetics is a biological technique which involves the use of light to control cells in living tissue, typically neurons, that have been genetically modified to express light-sensitive ion channels. Optic and genetic techniques are used to control and monitor the activities of individual neurons in living tissue and to measure the effects of the control in real-time. Light-sensitive proteins are used as reagents and neuronal control is achieved using optogenetic actuators such as channelrhodopsin, halorhodopsin, and archaerhodopsin. Optical recording of neuronal activities can be made with the help of optogenetic sensors for detecting the presence of chemicals, compounds and/or other indicators indicative of particular neural activity such as calcium, vesicular release (synapto-pHluorin), neurotransmitter (GluSnFRs, dopamine, serotonin, acetylcholine and others), or membrane voltage.

In illustrative embodiments, optogenetic device 500 may be configured to provide optical stimulation of opsin-doped neurons with blue light or other visible light, a visible light sensor configured to detect calcium ions ($Ca^{2+}$) by fluorescence, and glassy carbon electrodes configured to detect dopamine by fast scan cyclic voltammetry on a sapphire substrate ($Al_2O_3$). In one or more embodiments, the light-emitting diode, the light sensor, and the bio-electrode sensors are fabricated using materials that are compatible with a biological environment, such as a body, as well as compatible with processing needs of other integrated devices. In some embodiments, the light-emitting diode and the light sensor are fabricated using a gallium nitride (GaN) material, and the bio-electrode sensors are fabricated using a glassy carbon material. In one or more embodiments, glassy carbon is a non-graphitizing, or non-graphitizable, carbon which combines glassy and ceramic properties with those of graphite.

With reference to FIG. 5, an embodiment of a process for fabricating an optogenetic device 502 includes depositing or growing a zirconium diboride ($ZrB_2$) epitaxial layer 504 on a sapphire substrate ($Al_2O_3$) 502 as a buffer layer for GaN epitaxy. In some embodiments the $ZrB_2$ epitaxial layer is grown using an epitaxial growth process.

The process may further include depositing a multilayer LED stack 506 on the $ZrB_2$ epitaxial layer 504, for example using an epitaxial growth process. For example, in some embodiments the multilayer LED stack 506 may comprise a gallium nitride (GaN) multilayer LED stack for a blue LED device that is grown on the $ZrB_2$ epitaxial layer 504. It should be understood that a GaN multilayer LED stack may be fabricated according to one or more well-known GaN multilayer LED stack fabrication processes. In some embodiments, a fabricated GaN LED multilayer stack may comprise a number of layers including, for example, an n-GaN layer, an n-AlGaN clad layer, an InGaN emission layer, a p-AlGaN clad layer, and a p-GaN layer.

In some embodiments, a dielectric capping layer (not shown) may be deposited on the multilayer LED stack. For example, in some embodiments, the dielectric capping layer may comprise a silicon dioxide ($SiO_2$) or aluminum oxide ($Al_2O_3$) material.

In some embodiments, a photoresist layer (not shown) may be applied to portions of the dielectric capping layer and a pattern may be formed in the photoresist layer using common lithographic patterning processes. The pattern may then be transferred to the dielectric capping layer and the multilayer LED stack 506, for example, using an etching process such as, e.g., an ME process, to form a sensor region trench. The photoresist layer may then be removed using commonly known techniques. An optical sensor dielectric layer is then deposited on dielectric capping layer and the exposed surfaces of the sensor region trench. For example, the optical sensor dielectric layer may be composed of one or more of an $Al_2O_3$ material, an $SiO_2$ material, and a silicon nitride ($Si_3N_4$) material. In one or more embodiments, the optical sensor dielectric layer is deposited using a chemical vapor deposition (CVD) process followed by an annealing process. A portion of the optical sensor dielectric layer may then be etched away to form dielectric inner spacers 514A and 514B on the sides of the optical sensor region trench, for example, using an ME process. The dielectric inner spacers 514A and 514B are illustrated in FIG. 5.

An optical sensor 516 is formed in contact with the dielectric inner spacers 514A and 514B, for example, using epitaxial growth processes. In one or more embodiments, optical sensor 516 is a multilayer GaN optical sensor stack including an n-GaN layer, an i-GaN layer, and a p-GaN layer. Optical sensor 516 is also shown in FIG. 5. The dielectric layer is then removed and the multilayer LED stack 506, inner spacers 514A and 514B, and optical sensor 516 are planarized, for example, using a chemical planarization (CMP) process and a contact material 518 for the GaN devices (i.e., the LED device and the light sensor device) is deposited on upper surfaces of multilayer LED stack 506 and dielectric inner spacers 514A and 514B. In some embodiments, for example, contact material 518 comprises a metal material such as a gold (Au) or nickel (Ni) material.

Next, a second photoresist layer (not shown) is deposited on the contact material 518 and used to pattern the optical sensor, LED, and glassy carbon electrode regions using a lithographic patterning process. Portions of multilayer LED stack 506 are then etched to form an optical sensor conductor region, an LED region, and a glassy carbon electrode conductor region, for example, using an RIE process. The second photoresist layer is also removed.

Next, a third photoresist layer (not shown) is deposited on the optical sensor conductor region and the LED conductor region and used to pattern portions of $ZrB_2$ layer 504 to open a conductor for wiring contacts to the optical sensor conductor region and the LED conductor region and for glassy carbon electrode formation. In the embodiment, contact material 518 and the multilayer LED stack 506 within the glassy carbon electrode conductor region is further etched away, for example, using an RIE process. In the embodiment, the third photoresist layer is then removed.

Next, a spacer dielectric is deposited on portions of substrate 502, $ZrB_2$ layer 504, optical sensor 516, multilayer LED stack 506, and contact material 518 and is etched to form dielectric outer spacers 532.

A glassy carbon material is then deposited on the portions of substrate 502, $ZrB_2$ layer 504, optical sensor 516, multilayer LED stack 506, contact material 518 and dielectric outer spacers 532, for example, using a vapor phase chemical deposition process. A hard mask material is deposited on the glassy carbon material, for example, using the processes described above. In a particular embodiment, the hard mask material comprises a titanium (Ti)-based material.

A fourth photoresist layer is applied to the portions of the hard mask material and is used to form a pattern over the hard mask material and glassy carbon material using lithographic processes. The hard mask material and glassy carbon material are then etched according to the pattern of the fourth photoresist layer to form an optical sensor conductor 540, a multilayer LED stack conductor 542 and glassy carbon electrodes 544 disposed on portions of $ZrB_2$ layer 504. The fourth photoresist layer may then be removed as described above for the other photoresist layers. In some embodiments, the hard mask material and the glassy carbon material are etched using an RIE process. In some embodiments, hard mask material is removed from the top of the optical sensor conductor 540, multilayer LED stack conductor 542 and glassy carbon electrodes 544, for example, using a dilute hydrofluoric acid (DHF) or hydrogen peroxide ($H_2O_2$).

In some embodiments, when the glassy carbon material is etched to form the optical sensor conductor 540, multilayer LED stack conductor 542, and glassy carbon electrodes 544, the portions of glassy carbon electrodes 544 are connected together proximate to the $ZrB_2$ layer 504 due to an RIE lag effect in which portions of glassy carbon material are etched away at different rates resulting in portions of glassy carbon material of the glassy carbon electrodes 544 remaining disposed over the $ZrB_2$ layer 504, for example, as seen in FIG. 5.

In this manner an optogenetic device 500 may be fabricated for use as a sensor 404 in the sensor lattice 400. For example, sensor lattice 400 may comprise multiple optogenetic devices 500 fabricated as part of the one or more sensors 404 in the same pattern as the channel 103. In some embodiments, sensor lattice 400 may also or alternatively comprise any other type of sensor that may be utilized to stimulate or sense the activity of neurons 110.

Figure 6:
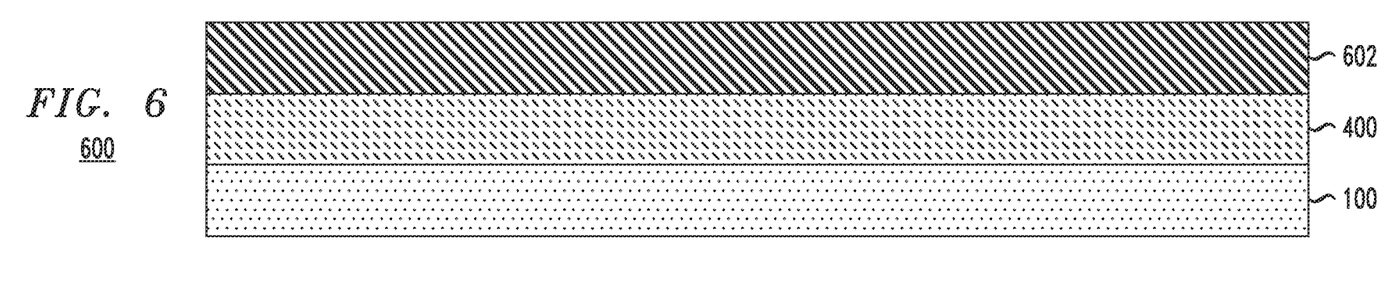
FIG. 6 is a schematic cross-sectional side view of a neuromorphic computing device, according to an embodiment of the present disclosure.

With reference now to FIG. 6, a neuromorphic computing device 600 according to an illustrative embodiment comprises neural lattice 100, sensor lattice 400, and a semiconductor device 602 joined together. Semiconductor device 602 may be fabricated according to any conventional technique for fabricating a semiconductor device, and may have contacts or other electrical connections that are configured to interface with corresponding contacts or electrical connections of sensor lattice 400 when semiconductor device 602 is joined to sensor lattice 400.

In illustrative embodiments, each portion of neuromorphic computing device 600 may be fabricated separately. For example, neural lattice 100, sensor lattice 400, and semiconductor device 602 may each be fabricated individually and then joined together. In some embodiments, sensor lattice 400 and semiconductor device 602 may be fabricated together as a single unit.

Figure 7:
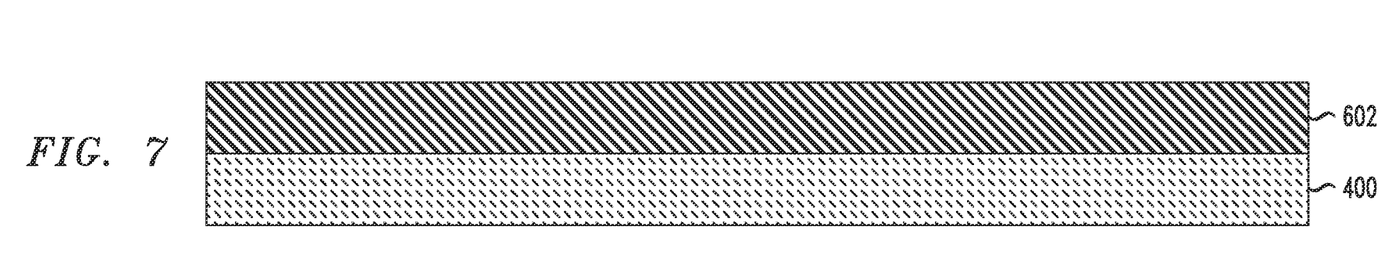
FIG. 7 is a schematic cross-sectional side view of a fabrication step for fabricating the neuromorphic computing device of FIG. 6, according to an embodiment of the present disclosure.

With reference now to FIG. 7, in some embodiments, sensor lattice 400 and semiconductor device 602 may be separately fabricated, as described above, and then joined together. For example, in some embodiments, sensor lattice 400 and semiconductor device 602 may be bonded together using a bonding process such as, e.g., a high temperature bonding process such as an annealing process at temperatures such as, e.g., 500° C. to 700° C. Other processes or temperatures may also or alternatively be used.

The combined sensor lattice 400 and semiconductor device 602 may then be joined to neural lattice 100, for example, as shown in FIG. 6, with the sensors 404 aligning with channel 103. In some embodiments, for example, the combined sensor lattice 400 and semiconductor device 602 may be joined to neural lattice 100 using a bonding technique. Example bonding techniques may include, for example, applying an adhesive coating such as, e.g., polydimethylsiloxane, silicones, polyimides, polyurethanes, or other similar adhesives, and applying heat or exposing the joined neural lattice 100, sensor lattice 400, and semiconductor device 602 to UV light at lower temperatures such as, e.g., 100° C. to 300° C. Other processes or temperatures may also or alternatively be used. In some embodiments, for example, sensor lattice 400 and neural lattice 100 may be joined together by wetting the surfaces with a biological solution and using Van der Waals forces to hold them together. In some embodiments, a low-pressure clamping device may also or alternatively be employed. In some embodiments, the method of bonding the combined sensor lattice 400 and semiconductor device 602 to the neural lattice 100 may be chosen such that the bonding process does not damage the neuron growth materials disposed in the seed chambers 104 of the neural lattice 100.

In illustrative embodiments, the sensor lattice 400 and semiconductor device 602 may be first joined together, as described above, followed a joining of the combined sensor lattice 400 and semiconductor device 602 with the neural lattice 100. In other embodiments, sensor lattice 400 may be joined to neural lattice 100 first followed by a joining of the combined sensor lattice 400 and neural lattice to the semiconductor device 602.

In illustrative embodiments, the seed chambers 104 of neural lattice 100 are seeded with neuron growth materials 108 prior to joining of the neural lattice 100 to the sensor lattice 400 or the combined sensor lattice 400 and semiconductor device 602. Once joined, the channel 103 is enclosed between the neural lattice 100 and sensor lattice 400 such that channel 103 serves as a fluid pathway for providing nutrients, stimulants, or other fluid materials to the neuron growth materials 108. For example, the channels 103 may provide the neuron growth materials 108 with a fluid containing a growth medium that causes the neuron growth materials 108 to grow into the neurons 110 and their axons 112, as shown in FIG. 3 above. In some embodiments, the growth of the neuron growth materials 108 into the neurons 110 and their axons 112 may also or alternatively be driven by the sensors 404, for example, using electrical, optical or magnetic stimulation. In other embodiments, the neuron growth materials 108 may be grown into the neurons 110 and their axons 112 using any other conventional techniques.

In illustrative embodiments, when the neuron growth materials 108 are stimulated to grow, the resulting neurons 110 and their axons 112 will grow against or proximate to the sensors 404 such that electrical or other measurements of the neurons 110 and axons 112 may be made by sensors 404 and stimulation may be provided to the neurons 110 and axons 112 by the sensors 404. By positioning sensors 404 in a lattice that is similar to channel 103, individual sensors 404 may be disposed adjacent or proximate to particular portions of corresponding neurons 110 and axons 112 such that the activity of such portions may be monitored and stimulated as described. This allows the activity of individual neurons 110 or even sub-portions of such neurons 110 including the activity of their individual axons 112 to be monitored, recorded, or otherwise determined for use in characterizing the function of the neurons 110 on an individual basis. In addition, the reaction of a single neuron 110 or axon 112 to stimulation from the sensors 404, e.g., electrical, optical, or magnetic stimulation, or to chemical stimulation from fluids contained within channel 103 may be monitored and characterized efficiently with little to no interference or noise of the sort that would be caused by the large number of neurons that are clumped together in a biological mass such as the brain of an animal.

Figure 8:
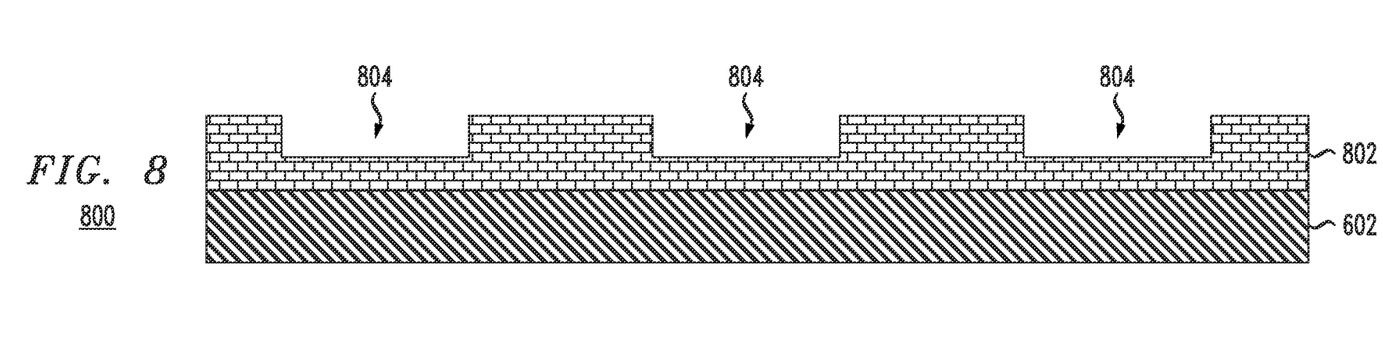
FIG. 8 is a schematic cross-sectional side view of a partially fabricated neuromorphic computing device, according to an alternate embodiment of the present disclosure.
Figure 9:
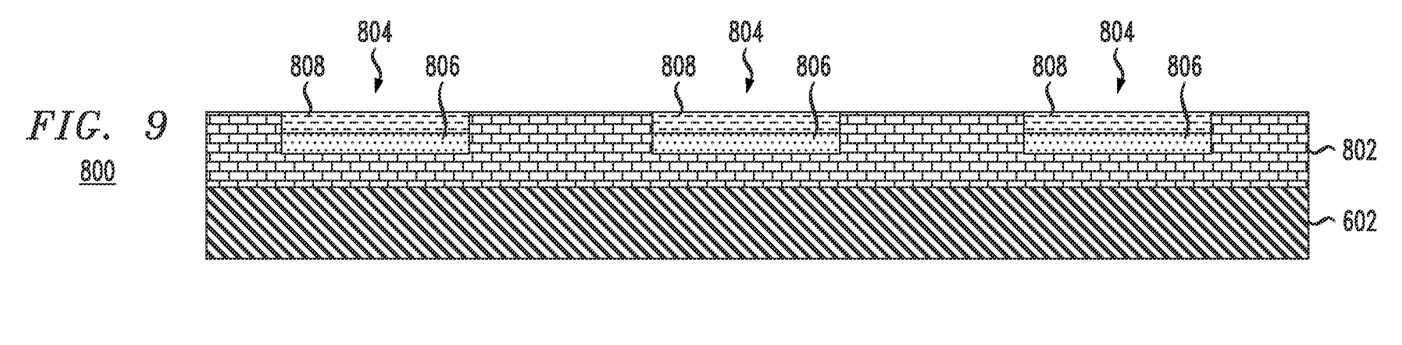
FIG. 9 is a schematic cross-sectional side view of the neuromorphic computing device of FIG. 8 including the formation of a sensor lattice and neural lattice, according to the alternate embodiment of the present disclosure.

In another illustrative embodiment, with reference now to FIGS. 8 and 9, the fabrication of an example neuromorphic device 800 is illustrated. With reference to FIG. 8, for example, semiconductor device 602 is formed as described above. In this embodiment, a sensor lattice 802 may be formed in a similar manner to sensor lattice 400 except that a channel 804 may be formed in a surface of the sensor lattice 802, e.g., via etching as described above, that will accommodate both sensors 806 and a neural lattice 808, as shown in FIG. 9. For example, with reference to FIG. 9, in some embodiments, sensors 806 may first be formed in the channel 804 of sensor lattice 802, for example, in the pattern and in the manner described above with respect to sensors 404, and a neural lattice 808 may be formed over the sensors 806 within the channel 804. In this embodiment, neural lattice 808 is formed directly in the channel 804 and does not require a separate substrate. For example, in an embodiment, channel 804 may be used in a similar manner to channel 103 of neural lattice 100. For example, the channel 804 may be seeded with neuron growth materials and growth of the seeded neuron growth materials may be stimulated, as described above. In some embodiments, a capping layer may be formed over the channel 804 to enclose the neural lattice 808 with the sensors 806.

The neuromorphic devices 600 and 800 described above may be used to simulate simple brain functions, for example, using sensors 404 or 806 to study and stimulate the interconnections between adjacent individual neurons 110 and their axons 112. For example, neuromorphic devices 600 and 800 may be used to determine the response of adjacent neurons 110 to various stimulating effects such as, e.g., chemical, electrical, optical or magnetic stimulation, such as, e.g., an increase in activity, connectivity or growth of adjacent axons 112 relative to other axons 112, growth of neurons 110, or other similar responses that may be used to characterize how adjacent neurons 110 change in response to stimulation. For example, the stimulation of a neuron 110 is known to induce various responses including genetic activation and expression of the neuron 110, actin synthesis, dendrite growth, and synapse formation and expansion.

Neuromorphic devices 600 and 800 are configured to monitor and characterize these responses on an individual neuron-by-neuron basis, axon-by-axon basis, or even sub-portion-by-sub-portion of the neurons 110 basis in addition to providing the stimulation itself for these characterizations. For example, sensors 404 and 806 may be used to intentionally induce and control neuron changes and neuron network changes. Since biological neural signals such as those found in the brain are very noisy and incompletely characterizable using embedded sensors due to the sheer volume of neurological activity, neuromorphic devices such as those described in illustrative embodiments above may be used to provide a structured lattice for both the neurons and their corresponding sensors that provides a good signal to noise ratio and enhances the precision of the signal characterization.

In illustrative embodiments, neuromorphic devices 600 and 800 may also function as computing devices that can read and write information between the semiconductor device 602 and the neurons 110. For example, responses of the neurons 110 to stimulation by the sensors 404 and 806 of neuromorphic devices 600 and 800 may be characterized and utilized to perform logical functions or function as memory devices.

For example, in some embodiments, the neural lattice 100 and neurons 110 may be structured in a manner that represents a logical function such that a stimulation of the neurons 110 by sensors 404 and 806 may, for example, implement that logical function. For example, a response to the stimulation that is obtained by the sensors 404 and 806 may be characterized to determine a result of that logical function.

In another example, neuromorphic devices 600 and 800 may use sensors 404 and 806 to stimulate the neurons 110 and their axons 112 in a particular manner to cause desired changes to the neurons 110 and their axons 112 that each represent a particular data value, e.g., a 0 or a 1. Any other type of data value may be represented. The sensor 404 or 806 may then obtain a signal associated with the change from the neurons 110 or their axons 112 at a later time and characterize that signal to determine the data value. For example, to store a value of zero in the neural lattice 110, sensors 404 may stimulate the neurons 110 or their axons 112 in a first manner and to store a value of one in the neural lattice 100, sensors 404 may stimulate the neurons 110 or their axons 112 in a second manner. The sensors 404 may then obtain signals from the neurons 110 at a later time and characterize those signals to determine whether the value is a one or a zero. In this manner, the neuromorphic devices 600 and 800 may be utilized as memory devices.

In some embodiments, neural lattice modules may be created as part of neuromorphic devices 600 and 800 that can be linked together to add multifunctional neural activity, e.g., different types of neural lattices may interact through and with one or more computing devices 602 to perform more complex functions. In some embodiments, the neural lattice 100 may comprise a three-dimensional neural lattice that provides for more complex interactions.

Figure 10:
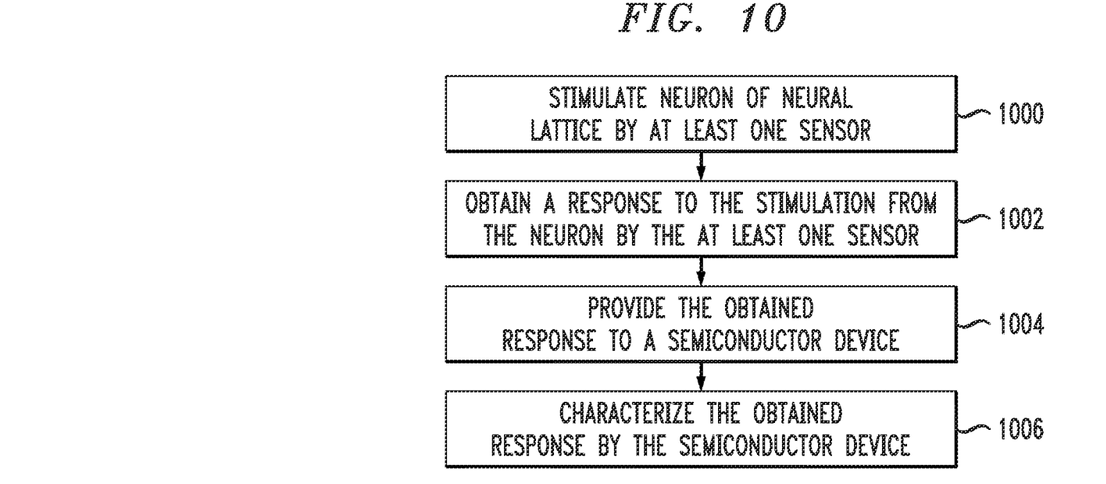
FIG. 10 is a flow diagram of techniques for using a neuromorphic computing device, according to an embodiment of the present disclosure.

With reference now to FIG. 10, an example method of using a neuromorphic computing device is disclosed.

At 1000, a neuron 110 of neural lattice 100 is stimulated by the at least one sensor 404, as described above.

At 1002, the at least one sensor 404 obtains a response to the stimulation from the neuron, for example, a signal or other response that is generated based at least in part on a change in the neuron 110 or its axons 112.

At 1004, the at least one sensor 404 provides the obtained response to the semiconductor device 602.

At 1006, the semiconductor device 602 characterizes the obtained response. For example, in some embodiments, the neural lattice 100 is structured such that the neurons 110 perform a logical function when stimulated in a particular manner and the obtained response, when characterized, indicates a result of the logical operation, for example, as described above.

In other embodiments, the neural lattice 100 is structured such that the neurons 110 function as memory such that the manner of stimulation by the at least one sensor 404 modifies the structure of the neurons 110 to represent particular values. In this manner, the obtained response, when characterized, indicates a value of the data stored in the neurons 110, for example, as described above.

It is to be understood that the methods discussed herein for fabricating a neuromorphic computing device can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a neuromorphic computing device comprising:
forming a neural lattice in a first substrate, the neural lattice comprising a plurality of seed chambers and extensions between the plurality of seed chambers;
forming a plurality of sensors in a second substrate, each sensor of the plurality of sensors being formed at a location that corresponds to one of the seed chambers of the neural lattice of the first substrate;
seeding the seed chambers of first substrate with biological neuron growth materials;
attaching the second substrate to the first substrate such that the plurality of sensors are located proximate to the biological neuron growth material seeded in their corresponding seed chambers of the neural lattice; and
stimulating growth of the seeded biological neuron growth materials to grow a neuron in each of the seed chambers and proximate to the corresponding sensor of the attached second substrate.

2. The method of claim 1, further comprising forming a semiconductor device in a third substrate and attaching the third substrate to the second substrate such that the plurality of sensors are in electrical communication with the semiconductor device.

3. The method of claim 2, wherein the third substrate is attached to the second substrate prior to the attachment of the second substrate to the first substrate.

4. The method of claim 2, wherein the third substrate is attached to the second substrate using a high temperature annealing process.

5. The method of claim 1, wherein stimulating growth of the seeded biological neuron growth materials comprises stimulating growth of the seeded biological neuron growth materials such that axons of the neurons grown in adjacent seed chambers are in proximity to one another.

6. The method of claim 1, wherein the neural lattice is formed as one of a two-dimensional neural lattice and a three-dimensional neural lattice.

7. The method of claim 1, wherein the second substrate is attached to the first substrate using at least one of Van der Waals forces and an adhesive coating.

8. The method of claim 5, wherein stimulating growth of the seeded biological neuron growth materials comprises stimulating growth of the seeded biological neuron growth materials such that the axons of the neurons grown in adjacent seed chambers are disposed in the extensions between the adjacent seed chambers.

9. The method of claim 8, further comprising forming a second plurality of sensors in the second substrate at locations that correspond to the extensions of the neural lattice of the first substrate, wherein:
the second substrate is attached to the first substrate such that the second plurality of sensors are located proximate to their corresponding extensions of the neural lattice; and
the second plurality of sensors are located proximate to the axons of the neurons grown in adjacent seed chambers.

10. The method of claim 1, wherein at least one of the sensors comprises an optogenetic device.

11. The method of claim 10, wherein the optogenetic device comprises at least one of a GaN light emitting diode, an optical sensor, and a glassy carbon electrode.

12. The method of claim 1, wherein the second substrate comprises a sapphire-based material.

13. The method of claim 1, wherein:
attaching the second substrate to the first substrate encloses the seed chambers and extensions between the first and second substrates as a fluid pathway; and
stimulating the growth of the seeded biological neuron growth materials comprises supplying a fluid growth medium to the neurons via the fluid pathway.

14. The method of claim 1, wherein stimulating the growth of the seeded biological neuron growth materials comprises stimulating the growth of the seeded biological neuron growth materials using the corresponding sensors.

* * * * *